US007196561B2

(12) United States Patent
Bhattacharya et al.

(10) Patent No.: US 7,196,561 B2
(45) Date of Patent: Mar. 27, 2007

(54) PROGRAMMABLE RESET SIGNAL THAT IS INDEPENDENT OF SUPPLY VOLTAGE RAMP RATE

(75) Inventors: Dipankar Bhattacharya, Macungie, PA (US); John C. Kriz, Palmerton, PA (US); Duane J. Loeper, Spring City, PA (US); Antonio M. Marques, Summit, NJ (US)

(73) Assignee: Agere Systems Inc., Allentown, PA (US)

( * ) Notice: Subject to any disclaimer, the term of this patent is extended or adjusted under 35 U.S.C. 154(b) by 133 days.

(21) Appl. No.: 10/925,613

(22) Filed: Aug. 25, 2004

(65) Prior Publication Data
US 2006/0044028 A1 Mar. 2, 2006

(51) Int. Cl.
*H03L 7/00* (2006.01)

(52) U.S. Cl. .................. 327/143; 327/198
(58) Field of Classification Search ............. 327/142, 327/143, 198
See application file for complete search history.

(56) References Cited

U.S. PATENT DOCUMENTS

| | | | | | |
|---|---|---|---|---|---|
| 4,884,041 | A | * | 11/1989 | Walker | 331/57 |
| 4,970,408 | A | * | 11/1990 | Hanke et al. | 327/143 |
| 5,534,804 | A | * | 7/1996 | Woo | 327/143 |
| 5,886,556 | A | * | 3/1999 | Ganger et al. | 327/206 |
| 6,085,327 | A | * | 7/2000 | Seng et al. | 713/300 |
| 6,160,428 | A | * | 12/2000 | Pasqualini | 327/142 |
| 6,181,172 | B1 | * | 1/2001 | Callahan | 327/143 |
| 6,204,704 | B1 | | 3/2001 | Williams et al. | 327/143 |
| 6,281,723 | B1 | * | 8/2001 | Tailliet | 327/143 |
| 6,492,848 | B1 | * | 12/2002 | Lee | 327/143 |
| 6,518,746 | B2 | * | 2/2003 | McClure | 324/158.1 |
| 6,549,048 | B2 | * | 4/2003 | Tailliet | 327/205 |
| 6,731,143 | B2 | * | 5/2004 | Kim | 327/143 |
| 6,744,291 | B2 | * | 6/2004 | Payne et al. | 327/143 |
| 6,759,852 | B1 | * | 7/2004 | Samad | 324/522 |
| 2004/0012419 | A1 | * | 1/2004 | Kim et al. | 327/143 |

* cited by examiner

Primary Examiner—Linh My Nguyen
Assistant Examiner—Thomas J. Hiltunen

(57) ABSTRACT

A PUR circuit for generating a reset signal includes a first node for receiving a reference voltage and a second node for receiving a supply voltage that is referenced with respect to the reference voltage. The circuit further includes a voltage level detector coupled between the first node and a third node, the voltage level detector being configured to generate a first control signal at the third node. The voltage level detector includes a first transistor having a first threshold voltage associated therewith. A resistance element is coupled between the second node and the third node, the resistance element having a first resistance value associated therewith. The circuit also includes an inverter having an input coupled to the third node and having an output for generating a second control signal in response to the first control signal. The inverter includes a second transistor having a second threshold voltage associated therewith which is lower than the first threshold voltage. The voltage level detector is configured such that the first control signal is substantially equal to the supply voltage when the supply voltage is less than a first voltage, and the first control signal is equal to a second voltage when the supply voltage is substantially equal to or greater than the first voltage. The second voltage is less than a lower switching point of the inverter, the first voltage being based at least in part on the first threshold voltage, the reset signal being a function of the second control signal.

18 Claims, 5 Drawing Sheets

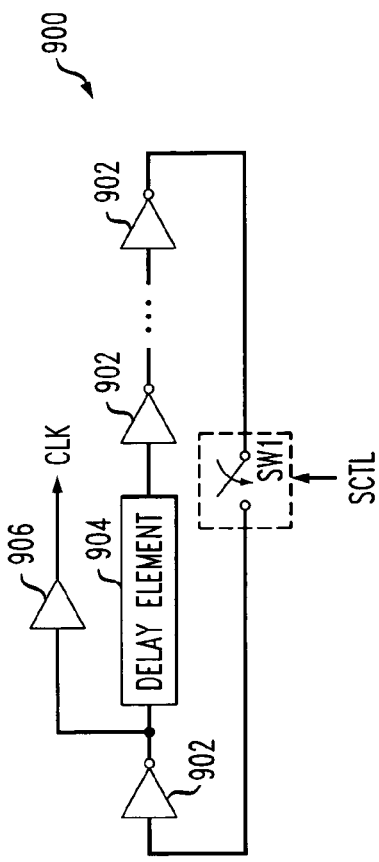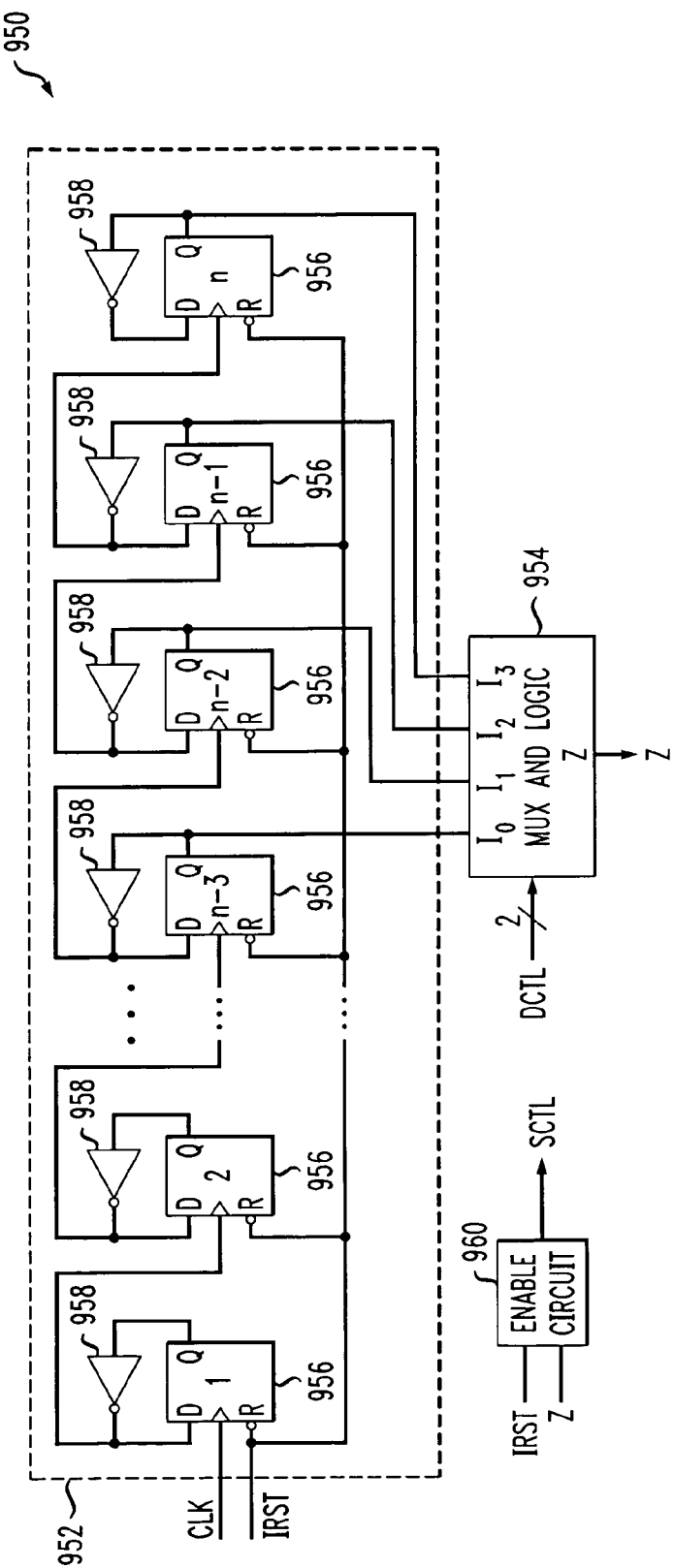
FIG. 9A
FIG. 9B

PROGRAMMABLE RESET SIGNAL THAT IS INDEPENDENT OF SUPPLY VOLTAGE RAMP RATE

FIELD OF THE INVENTION

The present invention relates generally to electronic circuits, and more particularly relates to techniques for generating a reset signal.

BACKGROUND OF THE INVENTION

In many electronic circuit applications, including, for example, digital logic circuitry, power is applied to a previously unpowered or sleeping circuit during a "power-up" phase, wherein the voltage (e.g., VDD) supplied to the circuit is generally increased from zero volts to a nominal operating value. During this power-up phase, it is often desirable and/or necessary to reset certain circuit elements, such as, for example, logic flip-flops, etc., to some known logical state, so as to initialize the circuit until the power supply voltage VDD attains a sufficient level to sustain reliable operation of the circuit. In order to accomplish this, a power-up reset (PUR) signal is generated during the power-up phase. This PUR signal, which is applied to appropriate control inputs of select circuit elements, is designed to hold the selected circuit elements in an initial or reset state until the power supply reaches a predetermined threshold voltage level. In this manner, the circuit can begin operation in a predictable logical state.

A PUR circuit is typically employed to generate the PUR signal for resetting the select circuit elements. One requirement of the PUR signal is that it must remain active beyond the time necessary for the power supply voltage to fully stabilize, so as to provide ample time for the select circuit elements to be properly reset. In some conventional methodologies for generating a PUR signal, a PUR circuit is employed which is only active for a fixed amount of time as measured from the point at which the supply starts ramping from zero. As shown in FIG. 1, this standard PUR circuit, which is generally referred to as a transient sensing PUR circuit, typically includes a resistor R1 and a capacitor C1 coupled to the input of an inverter I1 for setting a fixed time constant during which the PUR signal RST is asserted. The PUR signal generated by a transient sensing PUR circuit is dependent on a ramp rate of the supply voltage. Unfortunately, power supplies typically have widely varying ramp rates. Thus, a disadvantage of the transient sensing approach is that the PUR circuit may, in some instances, undesirably remove the PUR signal before the power supply voltage has fully stabilized, particularly when the power supply exhibits a slowly increasing ramp.

Other conventional PUR circuits, as shown in FIG. 2 and described, for example, in U.S. Pat. No. 6,204,704 to Williams et al., generate a PUR signal based on fixed direct current (DC) voltage levels for the supply voltage. Such circuits may be referred to as voltage level sensing PUR circuits. In the voltage level sensing PUR circuit depicted in FIG. 2, a PMOS transistor M1 is employed having a source terminal (S) connected to the supply voltage VDD, a gate terminal (G) connected to VSS, and a drain terminal (D) connected to VSS through a series resistor R1. An inverter I1 having an input connected to the drain terminal of M1 generates a reset signal RST as an output of the PUR circuit. However, while the voltage level sensing PUR circuit is essentially independent of the supply voltage ramp rate, this PUR circuit fails to take into consideration variations in certain process, voltage and/or temperature (PVT) conditions of the circuit, and thus, like the transient sensing PUR circuit, may undesirably remove the PUR signal before the supply voltage has fully stabilized.

There exists a need, therefore, for improved techniques for generating a PUR signal that does not suffer from one or more of the problems exhibited by conventional PUR circuitry.

SUMMARY OF THE INVENTION

The present invention meets the above-noted need by providing, in the illustrative embodiments, improved techniques for generating a reset signal that is independent of the supply voltage ramp rate and which is asserted beyond a time necessary for the supply voltage to stabilize, so that a circuit to which the reset signal is supplied can begin operation in a predictable logical state, over a desired range of PVT variations in the circuit.

In accordance with one aspect of the invention, a PUR circuit for generating a reset signal includes a first node for receiving a reference voltage and a second node for receiving a supply voltage that is referenced with respect to the reference voltage. The circuit further includes a voltage level detector coupled between the first node and a third node, the voltage level detector being configured to generate a first control signal at the third node. The voltage level detector includes a first transistor having a first threshold voltage associated therewith. A resistance element is coupled between the second node and the third node, the resistance element having a first resistance value associated therewith. The circuit also includes an inverter having an input coupled to the third node and having an output for generating a second control signal in response to the first control signal. The inverter includes a second transistor having a second threshold voltage associated therewith which is lower than the first threshold voltage. The voltage level detector is configured such that the first control signal is substantially equal to the supply voltage when the supply voltage is less than a first voltage, and the first control signal is equal to a second voltage when the supply voltage is substantially equal to or greater than the first voltage. The second voltage is less than a lower switching point of the inverter, the first voltage being based at least in part on the first threshold voltage, the reset signal being a function of the second control signal.

In accordance with another aspect of the invention, the PUR circuit further includes a programmable delay circuit having an input for receiving a third control signal and an output for generating the reset signal. The delay circuit is configurable for selectively adjusting a delay between a change of logical state of the second control signal and a change of logical state of the reset signal in response to the third control signal.

In an illustrative embodiment of the invention, a reset circuit is configured for generating a reset signal that is independent of a ramp rate of the supply voltage over a substantial portion of the ramp, for example, when the supply voltage increases to about 70 percent of its nominal steady state value. After the supply voltage has reached the desired threshold level, the reset signal remains asserted for a delay period which is selectively programmable for substantially a remainder of the supply voltage ramp.

These and other features and advantages of the present invention will become apparent from the following detailed description of illustrative embodiments thereof, which is to be read in connection with the accompanying drawings.

BRIEF DESCRIPTION OF THE DRAWINGS

FIGS. 9A and 9B are schematic diagrams of portions of an exemplary programmable divider circuit, formed in accordance with one embodiment of the invention.

DETAILED DESCRIPTION OF THE INVENTION

The present invention will be described herein in the context of illustrative reset circuits for generating a reset signal. It should be understood, however, that the present invention is not limited to these or any particular circuit arrangements. Rather, the invention is more generally applicable to improved techniques for generating a reset signal which is based, at least in part, on a sensed DC level of a supply voltage to the circuit, and may be based, in part, on a delay which is selectively programmable. The reset signal is therefore substantially independent of a ramp rate of the supply voltage and is asserted beyond a time necessary for the supply voltage to fully stabilize. Although implementations of the present invention are described herein with specific reference to N-type metal oxide semiconductor (NMOS) transistor devices, as may be formed using a complementary metal oxide semiconductor (CMOS) fabrication process, it is to be appreciated that the invention is not limited to such transistor devices and/or such a fabrication process, and that other suitable devices, such as, but not limited to, P-type metal oxide semiconductor (PMOS) devices, bipolar junction transistors (BJTs), etc., and/or processes (e.g., bipolar) may be similarly employed, as will be understood by those skilled in the art.

Figure 1:
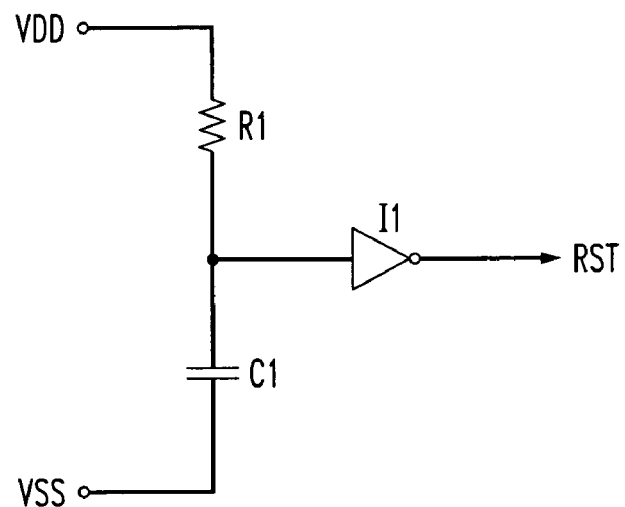
FIG. 1 is a schematic diagram depicting a conventional transient sensing PUR circuit.
Figure 2:
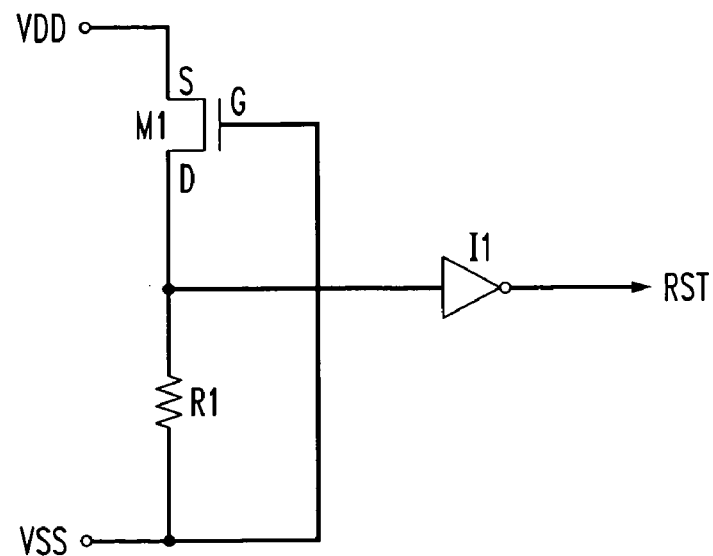
FIG. 2 is a schematic diagram depicting a conventional voltage level sensing PUR circuit.
Figure 3:
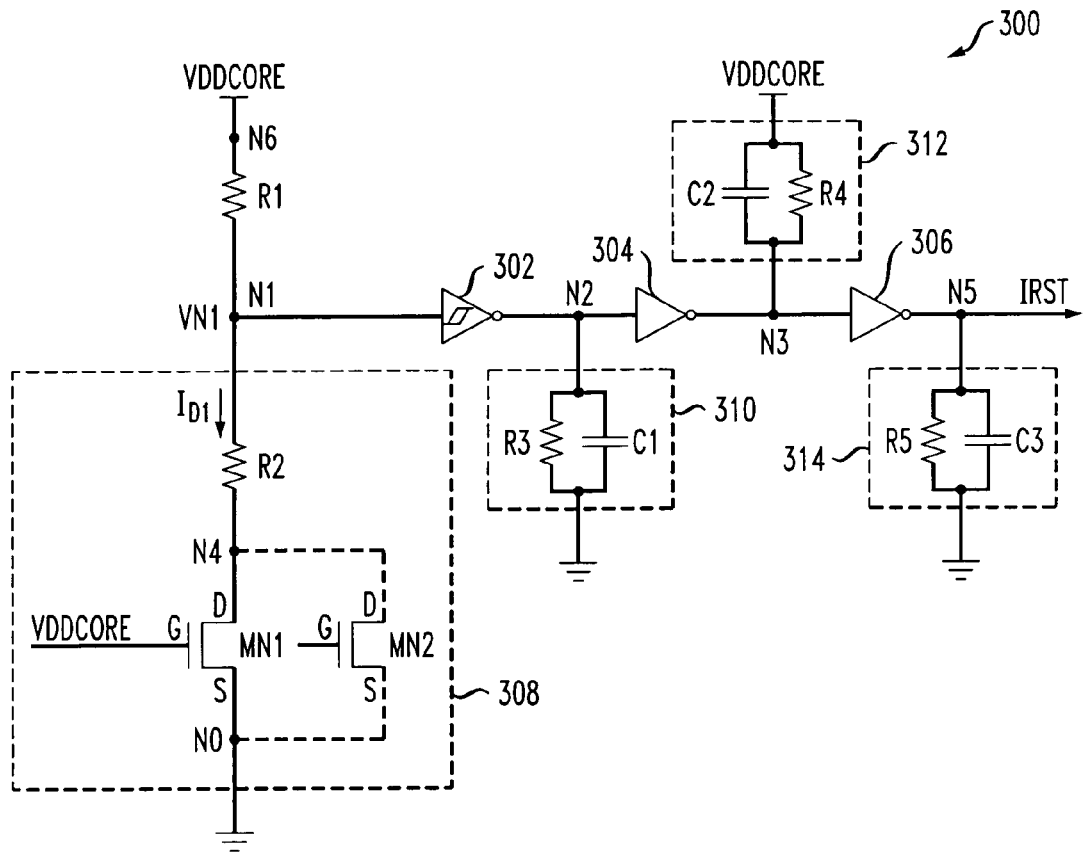
FIG. 3 is a schematic diagram illustrating an exemplary reset circuit, formed in accordance with one embodiment of the invention.

Referring now to FIG. 3, there is shown a schematic diagram illustrating an exemplary reset circuit 300 for generating a reset signal, formed in accordance with one embodiment of the invention. The reset circuit 300 may be used alone and/or as part of, for example, a PUR circuit, as will be described below. The reset circuit 300 includes a first node N0 for receiving a reference voltage, which may be ground, and a second node N6 for receiving a supply voltage, which may be VDDCORE, that is preferably referenced with respect to the reference voltage. It is to be appreciated that the reference voltage to which the supply voltage VDDCORE is referenced may also be a negative voltage, or some other potential that is less than the supply voltage. The reset circuit 300 preferably runs off the supply voltage VDDCORE, which may be about 1.0 volt, nominally. Reset circuit 300 further includes a voltage level detector 308, coupled between a first node N1 and ground, for sensing the supply voltage, and a resistor R1, or alternative passive resistance element, coupled between node N1 and VDDCORE. An inverter 302 having an input coupled to node N1 and an output coupled to node N2 generates a reset signal at node N2 which is a function of a control signal VN1 generated by the voltage level detector 308 at node N1. The control signal VN1 is primarily a function of the DC level of the supply voltage VDDCORE, as will be described in further detail below.

Reset circuit 300 may comprise one or more additional inverters for generating an output signal, IRST, which may be used for driving a PUR circuit or other external circuit. Specifically, the reset circuit 300 may include a second inverter 304 having an input coupled to node N2 and an output coupled to node N3, and a third inverter 306 having an input coupled to node N3 and an output coupled to node N5 which forms an output of the reset circuit. The inverters 304, 306, which may be implemented as standard inverters, serve at least in part to buffer the reset signal generated at node N2 so as to enable the reset circuit 300 to more easily drive capacitive loads to which the circuit may be coupled. Additionally, inverter 306 preferably provides an output signal IRST having voltage levels that are more closely compatible with standard logic levels. As will be understood by those skilled in the art, although the output signal IRST from the reset circuit 300 is of the same logic state as the reset signal generated at node N2, an inversion of the reset signal can be easily provided by using an odd number of inverters between node N2 and the output at node N5. The invention is therefore not limited to the specific number of inverters shown.

Voltage level detector 308 is configured to generate the control signal VN1 presented to inverter 302. The voltage level detector 308 preferably comprises a resistor R2 connected between node N1 and node N4, and an NMOS transistor MN1 having a source terminal (S) connected to ground, a gate terminal (G) connected to the supply voltage VDDCORE, and a drain terminal (D) connected to resistor R2 at node N4. Resistor R2, in conjunction with resistor R1, form a voltage divider network, as will be explained in further detail below. It is to be appreciated that, in the case of a simple metal oxide semiconductor (MOS) transistor device, because the MOS device is symmetrical in nature, and thus bidirectional, the assignment of source and drain designations in the MOS device is essentially arbitrary. Therefore, the source and drain terminals may be referred to generally as first and second source/drain terminals, respectively, where "source/drain" in this context denotes a source terminal or a drain terminal.

Unlike traditional transient sensing PUR circuits, the exemplary reset circuit 300 of the present invention senses a DC level of the supply voltage, and thus the reset signal generated by the reset circuit is advantageously independent of the supply voltage ramp rate.

Traditional mixed signal integrated circuit processes typically offer "high voltage" and "low voltage" transistor devices. The high voltage devices generally have a nominal threshold voltage of about 0.7 volts and are intended to operate with a higher supply voltage (e.g., about 3.3 volts). The low voltage devices generally have a nominal threshold voltage which is substantially lower than the high voltage devices, such as, for example, about 0.35 volts, and are intended to operate with the lower core supply voltage VDDCORE (e.g., about 1.0 volt). It is to be appreciated, however, that the invention is not limited to devices having these particular threshold voltages. In the exemplary reset circuit 300, all of the transistor devices, including, for example, transistor devices in inverters 302, 304 and 306, are low voltage transistor devices, except transistor MN1, which is preferably a high voltage transistor device. For example, the threshold voltage of NMOS and PMOS transistor devices (not shown) in inverters 302, 304 and 306 may be about 0.35 volt and the threshold voltage of transistor MN1 may be about 0.7 volt. Thus, in accordance with an illustrative embodiment of the invention, the exemplary reset circuit 300 is configured such that the control signal VN1 generated by the voltage level detector 308 will not change the logical state of inverter 302 until the supply voltage VDDCORE is greater than the threshold voltage of transistor MN1, which has a higher threshold voltage than all other transistors in the reset circuit, regardless of the PVT conditions of the circuit.

As will be apparent to those skilled in the art, until the supply voltage has attained a certain minimum threshold level (e.g., about 0.35 volt), the logical states of the inverters 302, 304, 306 at nodes N2, N3, N5, respectively, may be undefined. Accordingly, reset circuit 300 preferably includes passive load networks 310, 312 and 314 coupled to nodes N2, N3 and N5, respectively, for defining these nodes to known logical states. The passive load networks may comprise, for example, a resistor and a capacitor connected in parallel between a corresponding node and either ground or the supply voltage VDDCORE. With the inclusion of a parallel capacitor, the load network additionally serves as a low pass filter for substantially removing certain high-frequency components (e.g., glitches) from the output signal IRST.

When connected to ground, the passive network may be referred to as a pull-down network, and when connected to VDDCORE, the passive network may be referred to as a pull-up network. Specifically, since it is desired, in the illustrative embodiment, that the output signal IRST generated by reset circuit 300 be at a logic low (e.g., "0") state until the supply voltage has stabilized, passive network 314 is preferably configured as a pull-down network comprising a resistor R5 and a capacitor C3 connected in parallel between node N5 and ground. Passive network 312 is preferably configured as a pull-up network, since the input to inverter 306 must be a logical complement of its output, comprising a resistor R4 and a capacitor C2 connected in parallel between node N3 and the supply voltage VDDCORE. Similarly, passive network 310 is preferably configured as a pull-down network comprising a resistor R3 and a capacitor C1 connected in parallel between node N2 and ground. Alternative circuitry may be similarly employed for at least initially defining the reset circuit 300 to a known logical state.

Figure 4:
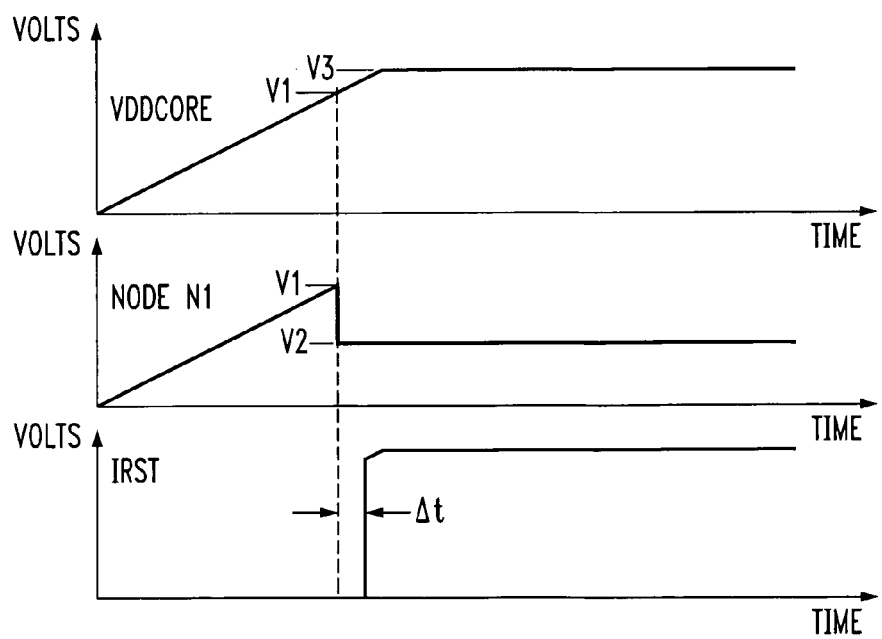
FIG. 4 is a graphical representation of exemplary waveforms corresponding to the reset circuit depicted in FIG. 3.

By way of example only, the operation of exemplary reset circuit 300 will now be described, with reference to the exemplary circuit waveforms shown in FIG. 4. Initially, when the supply voltage VDDCORE begins rising from the reference voltage, which in this case is about zero volts, all transistor devices in the circuit will be off (e.g., inactive). Since there will be essentially no current flowing in transistor MN1, the control signal VN1 at node N1 will be pulled up to the supply voltage via resistor R1, and thus will substantially track the supply voltage VDDCORE. When VDDCORE reaches a first voltage level V1, which is substantially equal to a threshold voltage of transistor MN1 (e.g., about 0.7 volt), MN1 turns on, thereby pulling node N4 to about ground potential (e.g., about zero volt). At this point, the supply voltage will already have exceeded a minimum level necessary for proper operation of inverters 302, 304, 306 (e.g., about 0.35 volt). The control signal VN1 at node N1 will drop accordingly from about V1 to a second voltage level V2, which is determined primarily by the resistance values selected for the voltage divider network comprising resistors R1 and R2. Ignoring the on-resistance of transistor MN1, the voltage V2 will be at least approximately determined by the expression $$V2 = VDDCORE \cdot \left(\frac{R2}{R1+R2}\right)$$

The values of resistors R1 and R2 are chosen such that voltage V2 remains below a lower switching point of inverter 302, which may be defined as the point at which the inverter switches from a logic low to a logic high state, for all values of VDDCORE within a desired range of operation. Additionally, R1 and R2 are preferably selected to be substantially high in resistance (e.g., hundreds of kilo (K) ohms) so as to minimize the current $I_{D1}$ dissipated in the voltage divider network. Control signal VN1 will remain at about voltage V2 as VDDCORE continues to rise to its steady state voltage level V3 (e.g., about 1.0 volt).

In response to the control signal VN1 dropping to voltage V2, the reset signal generated by inverter 302 will switch from a logic low state to a logic high state (e.g., "1") at node N2, resulting in a logic high output signal IRST being generated by the reset circuit 300. The time delay Δt between the change in logic state of the control signal VN1 and the change in logic state of the output IRST of reset circuit 300 will be determined primarily by the respective propagation delays of the inverters 302, 304, 306.

When the supply voltage VDDCORE falls from its steady state value V3, for example, when the core supply is powering down, the control signal VN1 remains low until VDDCORE falls below the threshold voltage of transistor MN1. As VDDCORE drops below the threshold voltage of transistor MN1, MN1 will turn off causing the control signal VN1 to rise above an upper switching point of the inverter 302, which may be defined as the point at which the inverter switches from a logic high to a logic low state, as the control signal substantially tracks the supply voltage VDDCORE. As the supply voltage continues to drop below a threshold voltage of the transistor device in the inverters 302, 304, 306, the corresponding passive networks 310, 312, 314, will define the logic state of the reset circuit 300.

In order to provide the reset circuit 300 with a certain degree of noise immunity, so as to reduce the likelihood that the reset circuit will generate glitches in the output signal IRST as the supply voltage stabilizes, inverter 302 preferably includes a desired amount of hysteresis. In this manner, the lower and upper switching points of the inverter 302 are preferably different from one another. In a preferred embodiment, the upper switching point of the inverter 302 is higher than the lower switching point. Alternatively, hysteresis can be added to the reset circuit, external to the inverter 302. For example, a second NMOS transistor MN2 can be optionally coupled in parallel with transistor MN1, such that a drain terminal (D) of MN2 is connected to the drain terminal of MN1 and a source terminal (S) of MN2 is connected to the source terminal of MN1. The gate terminal (G) of transistor MN2 may be connected such that MN2 is essentially only active during the time that the supply voltage VDDCORE is ramping down. A threshold voltage of transistor MN2 is preferably lower than the threshold voltage of transistor MN1, thereby effectively providing an upper switching point of the inverter 302 that is lower than if the transistor MN2 was not employed. For this reason, a low voltage transistor device is preferably utilized for transistor MN2.

Figure 5:
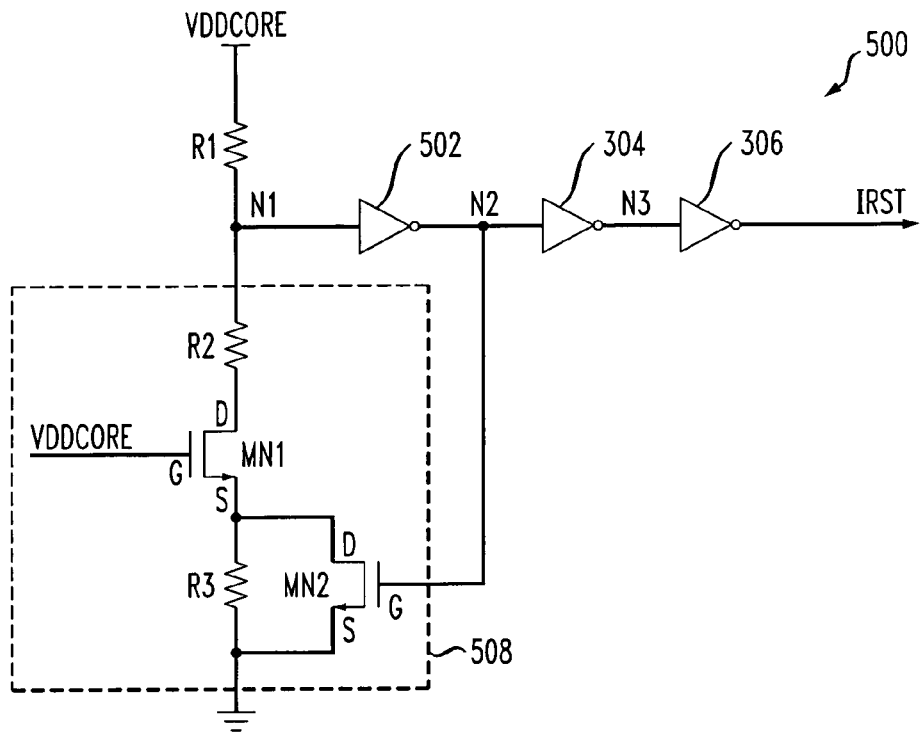
FIG. 5 is a schematic diagram illustrating an exemplary reset circuit, formed in accordance with another embodiment of the invention.

FIG. 5 is a schematic diagram illustrating an exemplary reset circuit 500, formed in accordance with another embodiment of the invention. The reset circuit 500, which is shown without pull-up and pull-down networks for ease of explanation, is essentially the same as the reset circuit 300 of FIG. 3, except that the hysteresis inverter 302 is replaced by a standard inverter 502 (e.g., similar to inverters 304 and 306), and the voltage level detector 508 in the reset circuit is slightly different compared to the voltage level detector 308 shown in FIG. 3. Specifically, voltage level detector 508 includes a source resistor R3, or alternative resistance element (e.g., transistor), coupled in series between the source terminal of transistor MN1 and ground. The inclusion of this source resistor R3 increases the voltage at which transistor MN1 turns on, thereby effectively increasing a threshold voltage of the device. In this manner, a low voltage transistor device (e.g., having a threshold voltage of about 0.35 volt) can be used in place of the high voltage transistor device utilized in reset circuit 300.

Hysteresis may be provided in reset circuit 500 by including a second NMOS transistor MN2 in the voltage level detector 508. Transistor MN2 is preferably configured as a switch, so as to selectively bypass source resistor R3 by connecting the source terminal of transistor MN1 to ground. Specifically, a drain terminal (D) of transistor MN2 may be connected to the source terminal of MN1 and a source terminal (S) of MN2 may be connected to ground. A gate terminal (G) of transistor MN2 is preferably coupled to the output of inverter 502 at node N2, so that MN2 is active only when node N2 is a logic high, and thus the output signal IRST is a logic high, and is inactive when node N2 is a logic low. Thus, when transistor MN2 is inactive, such as when output signal IRST is a logic low, the switching point of the inverter 502 is effectively higher compared to the switching point of inverter 502 when transistor MN2 is active. The amount of hysteresis in the reset circuit 500 can be selectively adjusted as desired, based primarily on a resistance value selected for the source resistor R3.

Figure 6:
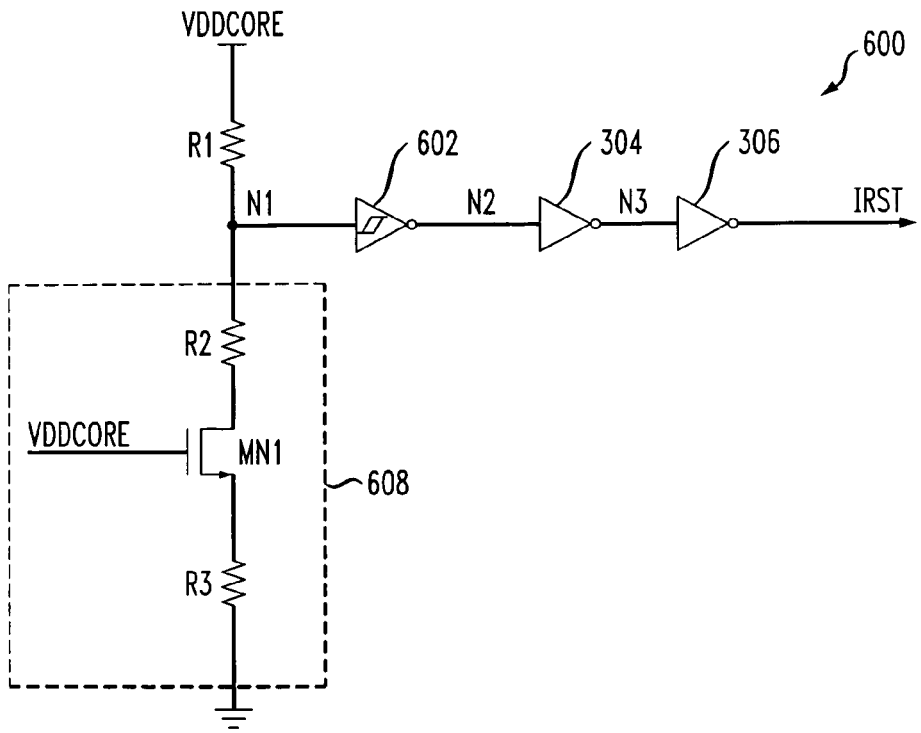
FIG. 6 is a schematic diagram illustrating an exemplary reset circuit, formed in accordance with a third embodiment of the invention.

FIG. 6 depicts an exemplary reset circuit 600, formed in accordance with a third embodiment of the invention. Reset circuit 600, like the reset circuit 500 shown in FIG. 5, preferably includes a voltage level detector 608 which is essentially identical to the voltage level detector 508 shown in FIG. 5, except that transistor MN2 is eliminated. Using this circuit arrangement, hystereis may be optionally provided in inverter 602, which may be similar to inverter 302 shown in the reset circuit 300 of FIG. 3.

Figure 7:
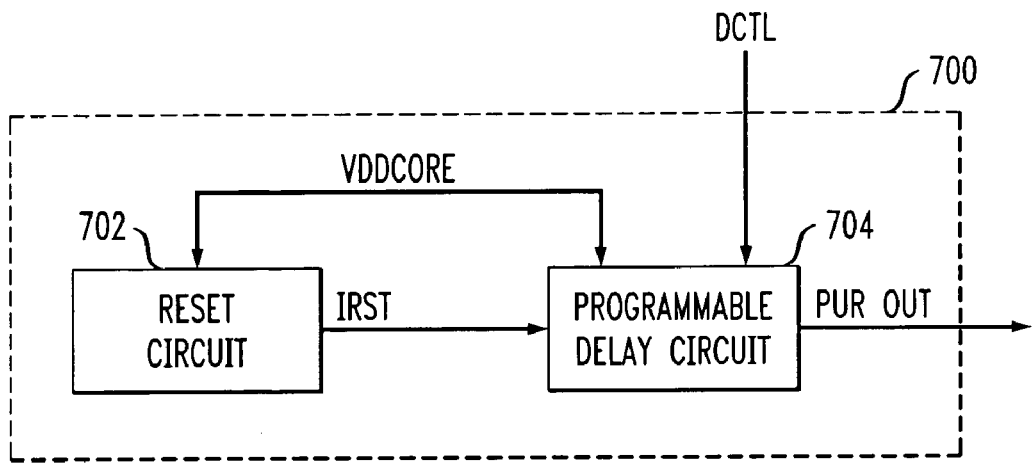
FIG. 7 is a bock diagram depicting an exemplary PUR circuit, formed in accordance with the present invention.
Figure 8:
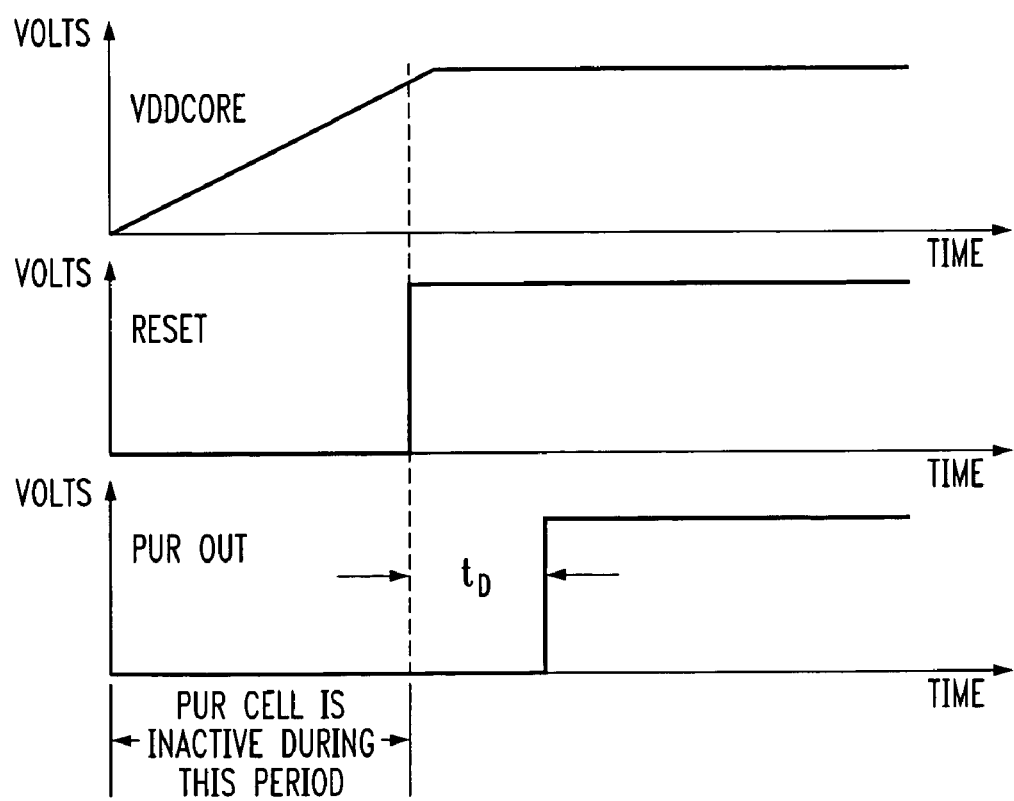
FIG. 8 is a graphical representation of exemplary waveforms corresponding to the PUR circuit depicted in FIG. 7.

FIG. 7 is a block diagram illustrating an exemplary PUR circuit 700, formed in accordance with an illustrative embodiment of the invention. The PUR circuit 700 preferably comprises a reset circuit 702, which may be similar to the reset circuits 300, 500 or 600 previously described, and a programmable delay circuit 704. Reset circuit 702 generates an output signal IRST which is asserted once the supply voltage VDDCORE has substantially reached its steady state value, as previously explained. Preferably, output signal IRST is asserted (e.g., logic high) once the supply voltage VDDCORE is greater than or equal to about seventy percent (70%) of its steady state value (e.g., about 1.0 volt). In accordance with another aspect of the invention, the output signal IRST generated by the reset circuit 702 is presented to the programmable delay circuit 704 which is configurable for generating an output PUR signal (PUR Out) that is delayed with respect to the signal IRST by a desired amount of time, $t_D$, which is preferably selectively variable in response to a control signal DCTL provided to the programmable delay circuit. FIG. 8 illustrates exemplary waveforms which may be generated by the PUR circuit 700, as described above.

FIGS. 9A and 9B are schematic diagrams illustrating portions of an exemplary programmable delay circuit which may be employed in the programmable delay circuit 704 shown in FIG. 7. It is to be appreciated that the invention is not limited to this or any particular programmable delay circuit arrangement. With reference to FIG. 9A, there is shown an exemplary clock generator 900 for generating a clock signal CLK of a desired frequency (e.g., about 44 megahertz (MHz)). As apparent from the figure, the clock generator 900 may be implemented as a ring oscillator comprising a plurality of inverters 902 connected in a series chain configuration. Specifically, an output of a first inverter is connected to an input of a successive inverter in the chain, and an output of a last inverter in the chain is connected to an input of the first inverter, thereby creating a loop. In order to sustain oscillation, positive feedback must be employed in the ring oscillator. This can be accomplished by utilizing an odd number of inverters 902 in the chain.

The frequency of the clock generator 900 will be based primarily on the total propagation delay through the chain of inverters 902. Since the delay of each inverter 902 is typically relatively small (e.g., less than one nanosecond), the number of inverters required to provide a clock signal of reasonable frequency, such as, for example, about 44 MHz, would be prohibitive. Consequently, the clock generator 900 preferably includes a variable delay element 904 connected in series between two consecutive inverters in the chain. The delay element 904, which may comprise, for example, a simple resistor-capacitor (RC) circuit (not shown), is operatively configured to slow down the clock signal CLK to a desired frequency. The clock signal CLK may be taken off the output of one of the inverters 902, preferably an inverter that is connected before the delay element 904 in the chain. In order to enable the clock signal to drive capacitive loads without significantly affecting the frequency of the signal, a buffer 906 may be connected to the output of one of the inverters 902. The buffer 906 may be inverting or non-inverting (as shown). The clock generator 900 may also include a switch SW1 which is configured so as to selectively disable the clock generator in order to conserve power. The switch SW1 may be implemented as a digital logic gate (e.g., OR gate), or other alternative switching circuitry, as will be understood by those skilled in the art.

With reference now to FIG. 9B, there is shown a programmable divider 950 comprising an n-stage binary counter 952, where n is a positive integer, and control circuitry 954 operatively coupled to the counter. The counter 952 may comprise, for example, a plurality of D flip-flops (DFFs) 956 connected together in a series chain configuration. Specifically, a clock input CLK of a first DFF 956 is connected to the clock signal CLK generated by the clock generator 900 of FIG. 9A, and an output signal Q generated by the first DFF is inverted by inverter 958 and fed back to a D input of the same DFF. The inverted output signal of the first DFF is also fed to the clock input CLK of a subsequent DFF 956, and so on down the chain of DFFs. While inverters 958 are not required for the counter to function, the inverters enable the output of a given DFF 956 to drive capacitive loads without significantly affecting the DFF. Therefore, inverters 958, or alternative buffering circuitry, are preferably used.

Each stage in the n-stage counter 952, which may comprise a DFF 956 and a corresponding inverter 958, generates an output signal having a frequency that is half the frequency of the signal applied to its clock input. Thus, the frequency of the output signal $Q_n$ generated by the nth stage in the counter 952 will be substantially equal to $f_{CLK}/2^n$, where $f_{CLK}$ is the frequency of the clock signal CLK generated by the clock generator 900. The control circuitry 954, which may comprise, for example, a multiplexer (MUX) and corresponding logic, is preferably employed to select one of the n stages in the counter 952 as an output Z of the programmable divider 950, as will be understood by those skilled in the art. In the exemplary programmable divider 950, the control circuitry 954 is implemented as a 4-bit MUX including four inputs $I_0$, $I_1$, $I_2$, $I_3$, a 2-bit control input for receiving delay control signal DCTL, and an output Z which is effectively coupled to one of the four inputs $I_0$ through $I_3$ in response to the delay control signal DCTL. Preferably, output signals, namely, $Q_{n-3}$, $Q_{n-2}$, $Q_{n-1}$ and $Q_n$, where $Q_n$ is the output signal generated by the nth DFF 956, corresponding to the last four stages in the counter 952 are coupled to respective inputs $I_0$, $I_1$, $I_2$, $I_3$ of the control circuitry 954. Although shown as a 4-bit MUX, the present invention contemplates that the control circuitry 954 may comprise essentially any size MUX. Moreover, the counter 952 may comprise essentially any number of stages, as will become apparent to those skilled in the art. Thus virtually any amount of delay between the assertion of the output signal IRST generated by the reset circuit 702 and the assertion of the output PUR signal can be generated by the programmable delay circuit 704 shown in FIG. 7.

Each of the DFFs 956 in the counter 952 further includes a reset input R which sets the output Q to a known state. All of the reset inputs of the DFFs are connected to the output signal IRST generated by the reset circuit 702 shown in FIG. 7. When IRST is a logic low, the outputs of all of the DFFs 956 will be a logic low, thereby disabling the counter. Once IRST goes to a logic high, the counter 952 begins counting up to the selected value, as indicated by output signal Z going to a logic high. The output PUR signal generated by the PUR circuit 700 of FIG. 7 is based on the output signal Z generated by the control circuitry 954. For example, PUR Out may be simply a buffered version of output signal Z.

In order to conserve power in the PUR circuit, the clock generator 900 is preferably configured so that it can be selectively disabled. To accomplish this, the clock generator includes a switch SW1, or similar enable circuitry, as previously stated. Since the clock generator is not required until the supply voltage has reach a desired threshold level, as indicated by assertion of the output signal IRST generated by the reset circuit 702 (see FIG. 7), switch SW1 is preferably enabled (e.g., closed) by IRST going to a logic high and is disabled (e.g., open) when IRST is a logic low. Additionally, once the counter has reached is selected count value, as indicated by the output Z going to a logic high, the switch SW1 can be disabled. Therefore, switch SW1 may include a control input for receiving a control signal SCTL which is asserted (e.g., logic high) only when IRST is a logic high and when the output signal Z from the control circuitry is a logic low. As shown in FIG. 9B, a clock enable circuit 960 may be used to generate the control signal SCTL for selectively disabling the clock generator 900 of FIG. 9A. The enable circuit 960 may comprise, for example, a logical AND gate (not shown) having a first input for receiving the signal IRST, a second input for receiving an inverted version of the output signal Z, and an output for generating the control signal SCTL.

The programmable delay period, wherein assertion of the output PUR signal is delayed from the assertion of the output signal IRST generated by the reset circuit, is preferably a function of the frequency of the clock signal CLK generated by the clock generator 900 of FIG. 9A, which is preferably established primarily by the delay element 904 in the clock generator 900 of FIG. 9A, and on which output signal Q of the counter 952 is selected, which is based on the delay control signal DCTL.

While illustrative embodiments of the reset circuit of the present invention have been shown and described herein comprising a voltage level detector including an NMOS transistor device, it is to be appreciated that a voltage level detector including a PMOS transistor device (not shown) in substitution for the NMOS device may be similarly employed, and the reset circuit modified accordingly, as will be understood by those skilled in the art.

One or more of the techniques of the present invention may be implemented at least in part in an integrated circuit including at least one die. A plurality of identical die are typically formed in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A power-up reset (PUR) circuit for generating a reset signal, the PUR circuit comprising:
    a first node for receiving a reference voltage and a second node for receiving a supply voltage;
    a voltage level detector coupled between the first node and a third node, the voltage level detector being configured to generate a first control signal at the third node, the voltage level detector including at least a first transistor having a first threshold voltage associated therewith;
    a resistance element coupled between the second node and the third node, the resistance element having a first resistance value associated therewith;
    an inverter having an input coupled to the third node and having an output for generating a second control signal in response to the first control signal, the inverter including at least a second transistor having a second threshold voltage associated therewith which is lower than the first threshold voltage; and
    a programmable delay circuit having an input for receiving a third control signal and an output for generating the reset signal, the delay circuit being configurable for selectively adjusting a delay between a change of logical state of the second control signal and a change of logical state of the reset signal in response to the third control signal;
    wherein the first control signal is substantially equal to the supply voltage when the supply voltage is less than a first voltage, and the first control signal is equal to a second voltage when the supply voltage is substantially equal to or greater than the first voltage, the second voltage being less than a lower switching point of the inverter, the first voltage being based at least in part on the first threshold voltage, the reset signal being a function of the second control signal.

2. The circuit of claim 1, wherein the programmable delay circuit comprises:

a clock generator;

at least one programmable counter coupled to the clock generator and configured for receiving the third control signal, the programmable counter generating a divide value which is a function of the third control signal; and control circuitry operatively coupled to the clock generator and to the at least one programmable counter, the control circuitry being operative to generate an output signal having a delay relative to the third control signal, the delay being a function of the divide value;

wherein the reset signal is a function of the output signal from the control circuitry.

3. The circuit of claim 2, further comprising clock enable circuitry operatively coupled to the clock generator and being operative to selectively disable the clock generator as a function of at least one of the second control signal and the output signal generated by the control circuitry.

4. The circuit of claim 2, wherein the clock generator comprises:

a ring oscillator comprising a plurality of inverter stages including first and last stages, the plurality of inverter stages being connected in a ring configuration, such that an output of a given inverter stage is coupled to an input of a successive inverter stage, the output of the last stage being coupled to the input of the first stage; and a variable delay element connected in series with the plurality of inverter stages, a frequency of the ring oscillator being based at least in part on a delay value of the delay element.

5. A power-up reset (PUR) circuit for generating a reset signal, the PUR circuit comprising:

a first node for receiving a reference voltage and a second node for receiving a supply voltage;

a voltage level detector coupled between the first node and a third node, the voltage level detector being configured to generate a first control signal at the third node, the voltage level detector including at least a first transistor having a first threshold voltage associated therewith;

a resistance element coupled between the second node and the third node, the resistance element having a first resistance value associated therewith; and an inverter having an input coupled to the third node and having an output for generating a second control signal in response to the first control signal, the inverter including at least a second transistor having a second threshold voltage associated therewith which is lower than the first threshold voltage;

wherein the first control signal is substantially equal to the supply voltage when the supply voltage is less than a first voltage, and the first control signal is equal to a second voltage when the supply voltage is substantially equal to or greater than the first voltage, the second voltage being less than a lower switching point of the inverter, the first voltage being based at least in part on the first threshold voltage, the reset signal being a function of the second control signal;

wherein the voltage level detector comprises:

the first transistor including a source terminal coupled to the first node, a drain terminal coupled to a fourth node, and a gate terminal coupled to the second node; and a second resistance element coupled between the third and fourth nodes, the second resistance element having a second resistance value associated therewith;

wherein the second voltage is a function of the first and second resistance values.

6. A power-up reset (PUR) circuit for generating a reset signal, the PUR circuit comprising:

a first node for receiving a reference voltage and a second node for receiving a supply voltage;

a voltage level detector coupled between the first node and a third node, the voltage level detector being configured to generate a first control signal at the third node, the voltage level detector including at least a first transistor having a first threshold voltage associated therewith;

a resistance element coupled between the second node and the third node, the resistance element having a first resistance value associated therewith; and an inverter having an input coupled to the third node and having an output for generating a second control signal in response to the first control signal, the inverter including at least a second transistor having a second threshold voltage associated therewith which is lower than the first threshold voltage;

wherein the first control signal is substantially equal to the supply voltage when the supply voltage is less than a first voltage, and the first control signal is equal to a second voltage when the supply voltage is substantially equal to or greater than the first voltage, the second voltage being less than a lower switching point of the inverter, the first voltage being based at least in part on the first threshold voltage, the reset signal being a function of the second control signal;

wherein the voltage level detector comprises:

the first transistor including a source terminal coupled to a fourth node, a drain terminal coupled to a fifth node, and a gate terminal coupled to the second node;

a second resistance element coupled between the third and fifth nodes, the second resistance element having a second resistance value associated therewith; and a third resistance element coupled between the first and fourth nodes, the third resistance element having a third resistance value associated therewith;

wherein the first voltage is a function of the first threshold voltage and the third resistance value.

7. A power-up reset (PUR) circuit for generating a reset signal, the PUR circuit comprising:

a first node for receiving a reference voltage and a second node for receiving a supply voltage;

a voltage level detector coupled between the first node and a third node, the voltage level detector being configured to generate a first control signal at the third node, the voltage level detector including at least a first transistor having a first threshold voltage associated therewith;

a resistance element coupled between the second node and the third node, the resistance element having a first resistance value associated therewith; and an inverter having an input coupled to the third node and having an output for generating a second control signal in response to the first control signal, the inverter including at least a second transistor having a second threshold voltage associated therewith which is lower than the first threshold voltage;

wherein the first control signal is substantially equal to the supply voltage when the supply voltage is less than a first voltage, and the first control signal is equal to a second voltage when the supply voltage is substantially equal to or greater than the first voltage, the second voltage being less than a lower switching point of the inverter, the first voltage being based at least in part on the first threshold voltage, the reset signal being a function of the second control signal;

wherein the voltage level detector comprises:

the first transistor including a source terminal coupled to the first node, a drain terminal coupled to a fourth node, and a gate terminal coupled to the second node;

a second resistance element coupled between the third and fourth nodes, the second resistance element having a second resistance value associated therewith; and a second transistor including a source terminal coupled to the first node, a drain terminal coupled to the fourth node, and a gate terminal for receiving a third control signal, the third control signal being operative to activate the second transistor when the supply voltage is ramping down and to disable the second transistor otherwise, the second transistor having a threshold voltage which is lower than the first transistor.

8. The circuit of claim 1, wherein the inverter includes hysteresis configured such that the lower switching point of the inverter is different than an upper switching point of the inverter.

9. The circuit of claim 1, further comprising a passive network coupled to the output of the inverter for setting the output of the inverter to a known logical state at least during a period when the supply voltage is less than the second threshold voltage.

10. An integrated circuit including at least one power-up reset (PUR) circuit for generating a reset signal, the at least one PUR circuit comprising:

a first node for receiving a reference voltage and a second node for receiving a supply voltage;

a voltage level detector coupled between the first node and a third node, the voltage level detector being configured to generate a first control signal at the third node, the voltage level detector including at least a first transistor having a first threshold voltage associated therewith;

a resistance element coupled between the second node and the third node, the resistance element having a first resistance value associated therewith;

an inverter having an input coupled to the third node and having an output for generating a second control signal in response to the first control signal, the inverter including at least a second transistor having a second threshold voltage associated therewith which is lower than the first threshold voltage; and a programmable delay circuit having an input for receiving a third control signal and an output for generating the reset signal, the delay circuit being configurable for selectively adjusting a delay between a change of logical state of the second control signal and a change of logical state of the reset signal in response to the third control signal;

wherein the first control signal is substantially equal to the supply voltage when the supply voltage is less than a first voltage, and the first control signal is equal to a second voltage when the supply voltage is substantially equal to or greater than the first voltage, the second voltage being less than a lower switching point of the inverter, the first voltage being based at least in part on the first threshold voltage, the reset signal being a function of the second control signal.

11. The integrated circuit of claim 10 wherein the programmable delay circuit comprises:

a clock generator;

at least one programmable counter coupled to the clock generator and configured for receiving the third control signal, the programmable counter generating a divide value which is a function of the third control signal; and control circuitry operatively coupled to the clock generator and to the at least one programmable counter, the control circuitry being operative to generate an output signal having a delay relative to the third control signal, the delay being a function of the divide value;

wherein the reset signal is a function of the output signal from the control circuitry.

12. The integrated circuit of claim 11, wherein the programmable delay circuit further comprises clock enable circuitry operatively coupled to the clock generator and being operative to selectively disable the clock generator as a function of at least one of the second control signal and the output signal generated by the control circuitry.

13. The integrated circuit of claim 11, wherein the clock generator comprises:

a ring oscillator comprising a plurality of inverter stages including first and last stages, the plurality of inverter stages being connected in a ring configuration, such that an output of a given inverter stage is coupled to an input of a successive inverter stage, the output of the last stage being coupled to the input of the first stage; and a variable delay element connected in series with the plurality of inverter stages, a frequency of the ring oscillator being based at least in part on a delay value of the delay element.

14. An integrated circuit including at least one power-up reset (PUR) circuit for generating a reset signal, the at least one PUR circuit comprising:

a first node for receiving a reference voltage and a second node for receiving a supply voltage;

a voltage level detector coupled between the first node and a third node, the voltage level detector being configured to generate a first control signal at the third node, the voltage level detector including at least a first transistor having a first threshold voltage associated therewith;

a resistance element coupled between the second node and the third node, the resistance element having a first resistance value associated therewith; and an inverter having an input coupled to the third node and having an output for generating a second control signal in response to the first control signal, the inverter including at least a second transistor having a second threshold voltage associated therewith which is lower than the first threshold voltage;

wherein the first control signal is substantially equal to the supply voltage when the supply voltage is less than a first voltage, and the first control signal is equal to a second voltage when the supply voltage is substantially equal to or greater than the first voltage, the second voltage being less than a lower switching point of the inverter, the first voltage being based at least in part on the first threshold voltage, the reset signal being a function of the second control signal;

wherein the voltage level detector comprises:

the first transistor including a source terminal coupled to the first node, a drain terminal coupled to a fourth node, and a gate terminal coupled to the second node; and a second resistance element coupled between the third and fourth nodes, the second resistance element having a second resistance value associated therewith;

wherein the second voltage is a function of the first and second resistance values.

15. An integrated circuit including at least one power-up reset (PUR) circuit for generating a reset signal, the at least one PUR circuit comprising:

a first node for receiving a reference voltage and a second node for receiving a supply voltage:

a voltage level detector coupled between the first node and a third node, the voltage level detector being configured to generate a first control signal at the third node, the voltage level detector including at least a first transistor having a first threshold voltage associated therewith;

a resistance element coupled between the second node and the third node, the resistance element having a first resistance value associated therewith; and an inverter having an input coupled to the third node and having an output for generating a second control signal in response to the first control signal, the inverter including at least a second transistor having a second threshold voltage associated therewith which is lower than the first threshold voltage;

wherein the first control signal is substantially equal to the supply voltage when the supply voltage is less than a first voltage, and the first control signal is equal to a second voltage when the supply voltage is substantially equal to or greater than the first voltage, the second voltage being less than a lower switching point of the inverter, the first voltage being based at least in part on the first threshold voltage, the reset signal being a function of the second control signal;

wherein the voltage level detector comprises:

the first transistor including a source terminal coupled to a fourth node, a drain terminal coupled to a fifth node, and a gate terminal coupled to the second node;

a second resistance element coupled between the third and fifth nodes, the second resistance element having a second resistance value associated therewith; and a third resistance element coupled between the first and fourth nodes, the third resistance element having a third resistance value associated therewith;

wherein the first voltage is a function of the first threshold voltage and the third resistance value.

16. An integrated circuit including at least one power-up reset (PUR) circuit for generating a reset signal, the at least one PUR circuit comprising:

a first node for receiving a reference voltage and a second node for receiving a supply voltage;

a voltage level detector coupled between the first node and a third node, the voltage level detector being configured to generate a first control signal at the third node, the voltage level detector including at least a first transistor having a first threshold voltage associated therewith;

a resistance element coupled between the second node and the third node, the resistance element having a first resistance value associated therewith; and an inverter having an input coupled to the third node and having an output for generating a second control signal in response to the first control signal, the inverter including at least a second transistor having a second threshold voltage associated therewith which is lower than the first threshold voltage;

wherein the first control signal is substantially equal to the supply voltage when the supply voltage is less than a first voltage, and the first control signal is equal to a second voltage when the supply voltage is substantially equal to or greater than the first voltage, the second voltage being less than a lower switching point of the inverter, the first voltage being based at least in part on the first threshold voltage, the reset signal being a function of the second control signal;

wherein the voltage level detector comprises:

the first transistor including a source terminal coupled to the first node, a drain terminal coupled to a fourth node, and a gate terminal coupled to the second node;

a second resistance element coupled between the third and fourth nodes, the second resistance element having a second resistance value associated therewith; and a second transistor including a source terminal coupled to the first node, a drain terminal coupled to the fourth node, and a gate terminal for receiving a third control signal, the third control signal being operative to activate the second transistor when the supply voltage is ramping down and to disable the second transistor otherwise, the second transistor having a threshold voltage which is lower than the first transistor.

17. The integrated circuit of claim 10, further comprising a passive network coupled to the output of the inverter for setting the output of the inverter to a known logical state at least during a period when the supply voltage is less than the second threshold voltage.

18. The integrated circuit of claim 11, wherein the inverter includes hysteresis configured such that the lower switching point of the inverter is different than an upper switching point of the inverter.

* * * * *

UNITED STATES PATENT AND TRADEMARK OFFICE
CERTIFICATE OF CORRECTION

| | | |
|---|---|---|
| PATENT NO. | : 7,196,561 B2 | Page 1 of 1 |
| APPLICATION NO. | : 10/925613 | |
| DATED | : March 27, 2007 | |
| INVENTOR(S) | : D. Bhattacharya et al. | |

It is certified that error appears in the above-identified patent and that said Letters Patent is hereby corrected as shown below:

Claim 18, col. 16, line 45, please delete "11" and insert --10--.

Signed and Sealed this

Thirty-first Day of July, 2007

JON W. DUDAS
*Director of the United States Patent and Trademark Office*